United States Patent [19]
Tamlyn et al.

[11] Patent Number: 6,009,026
[45] Date of Patent: Dec. 28, 1999

[54] COMPRESSED INPUT/OUTPUT TEST MODE

[75] Inventors: Robert Tamlyn, Jericho, Vt.; Edward Butler, Chandler, Ariz.

[73] Assignee: International Business Machines Corporation, Armonk, N.Y.

[21] Appl. No.: 08/901,509

[22] Filed: Jul. 28, 1997

[51] Int. Cl.[6] ................................................ G11C 7/00
[52] U.S. Cl. ............... 365/201; 365/230.05; 365/189.07; 371/21.1; 371/22.31
[58] Field of Search ............................. 365/201, 230.05, 365/189.07; 371/21.1, 22.31

[56] References Cited

U.S. PATENT DOCUMENTS

| | | | |
|---|---|---|---|
| 4,464,750 | 8/1984 | Tatematsu | 371/21 |
| 4,541,090 | 9/1985 | Shira-gasawa | 371/21 |
| 4,672,582 | 6/1987 | Nishimura et al. | 365/201 |
| 4,744,061 | 5/1988 | Takemae et al. | 365/201 |
| 4,873,669 | 10/1989 | Furutani et al. | 365/189.01 |
| 5,231,605 | 7/1993 | Lee | 365/201 |
| 5,311,473 | 5/1994 | McClure et al. | 365/201 |
| 5,367,492 | 11/1994 | Kawamoto et al. | 365/201 |
| 5,377,144 | 12/1994 | Brown | 365/189.02 |
| 5,400,342 | 3/1995 | Matsumura et al. | 365/201 |
| 5,408,435 | 4/1995 | McClure et al. | 365/201 |
| 5,436,911 | 7/1995 | Mori | 371/21.1 |
| 5,717,643 | 2/1998 | Iwanami et al. | 365/201 |
| 5,777,932 | 7/1998 | Chonan | 365/201 |

*Primary Examiner*—David Nelms
*Assistant Examiner*—VanThu Nguyen
*Attorney, Agent, or Firm*—Schmeiser, Olsen & Watts; Robert A. Walsh

[57] ABSTRACT

The present invention discloses a system and method of testing semiconductor memory devices formed as integrated circuits on semiconductor substrates. The present invention allows parallel testing of arrays using only one input/output (I/O or DQ) to write to the arrays and only two DQs to read from the arrays. The broad search should be directed to methods of compressing the time and number of I/O's required for testing wide, high pin count, or highly partitioned memory arrays. The specific method of this invention comprises simultaneously writing the same test bit to each array, simultaneously reading a common address from each array and comparing the output of each array to report a fail if all outputs are not the same.

10 Claims, 1 Drawing Sheet

COMPRESSED INPUT/OUTPUT TEST MODE

TECHNICAL FIELD

This invention relates to testing semiconductor memory devices formed as integrated circuits on semiconductor substrates and particularly relates to simplifying testing of the memory arrays.

BACKGROUND ART

Semiconductor memory parts must be tested after fabrication to eliminate unrepairable parts and identify parts that can be repaired by use of redundancy circuits. This procedure occurs in a normal process of manufacturing. This testing is time consuming and the test fixtures and equipment used for testing are expensive. In memory parts capable of storing millions of bits, the time and equipment expenses become large portions of the cost of manufacturing. In such parts, every addressable location in the memory array must have a bit written to it and read from it numerous times with many different data patterns to ascertain that the part operates correctly.

Semiconductor memory parts generally and dynamic random access memories (DRAMs), in particular, often contain a large array of memory cells subdivided into several separate, equally sized and internally addressable subarrays of equal size. Dividing the array into subarrays facilitates manufacturing the parts. These subarrays of memory cells all have the same or like internal address leads connected to them so that each subarray is accessed in a like manner. The subarrays thus are bitmapped alike.

In order to test Random Access Memory (RAM), it is necessary to apply many different patterns to the internal memory to find any and all defects. These defects are seen when the memory pattern inside the chip is such that the defect causes a memory cell to fail, or one memory cell or cells to interfere with another memory cell or cells. A problem in testing DRAMS requires writing patterns to each array, writing out data and comparing the output to the input to determine if there was an array fail. In chips organized such that each array has its own Input/Output (I/O or DQ) a pattern must be sent to each DQ. In wide DRAMs with many DQs many connections must be made as well as many tests performed.

SUMMARY OF THE INVENTION

The present invention discloses an integrated circuit comprising: a plurality of I/O terminals including a first and second I/O terminal; a plurality of memory arrays corresponding to each of the I/O terminals; and first test circuitry responsive to data bits on the first I/O terminal for simultaneously writing said data bits to the plurality of memory arrays.

The present invention discloses a method for testing a multi-bit I/O memory comprising: writing simultaneously the same test bit to each of a plurality of memory arrays; reading simultaneously a common address from each of the plurality of memory arrays; comparing the output of each of the plurality of memory arrays to an expected value; and providing an error signal when output data for each of the plurality of memory arrays is not the same as the expected value.

The present invention discloses an improved way of testing RAMs by taking advantage of the partitioned nature of most RAM designs, especially wide I/O DRAMs.

It is an advantage of the present invention to provide a DRAM having a reduced test time period.

It is an advantage of the present invention to provide a significant test time saving.

It is an advantage of the present invention to reduce the number of I/Os that the tester must interrogate on the dynamic random access memory (DRAM) chip.

DESCRIPTION OF THE PREFERRED EMBODIMENTS

Figure 1:
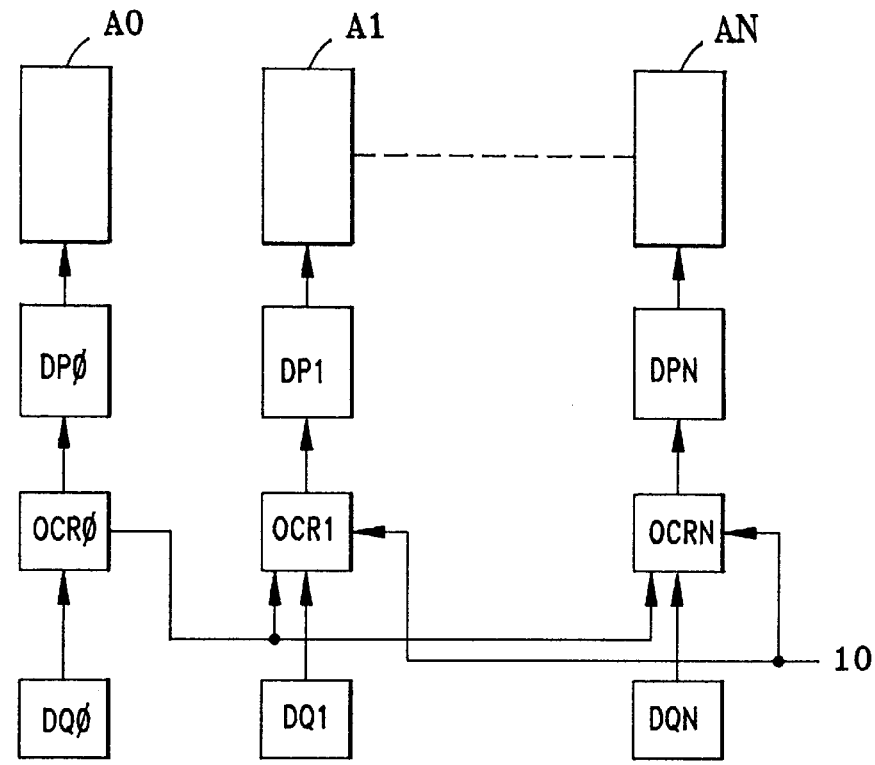
FIG. 1 shows the circuit for writing a test pattern into the entire chip memory.

Although the present invention has been described above in specific terms, the description should be regarded as illustrative rather than limitative. Thus, workers of ordinary skill in the art will appreciate that the invention may be otherwise practiced, but that such alternative modes are encompassed by the terms of the following claims and equivalents thereto.

It should be noted that the circuits in the drawings have P-channel field effect transistors (PFETs) indicated by a rectangle with a diagonal line formed within the rectangle and with a line adjacent and parallel to one side of the rectangle indicating the gate or control electrode of the semiconductor substrate made of a single crystal silicon or the like by the well-known technology of manufacturing semiconductor integrated circuits.

In the description of the present invention, the capital letter D refers to data being written to the memory array while the letter Q refers to data being read from the memory array. A combination of the two letters, DQ, refers to the bit that can be either written or read. One skilled in the art will understand that the memory part contains many other circuits that are not depicted, that are necessary or desirable for operation of a DRAM, and that are well known.

In the description of the present invention, the term "I/O terminal" refers to either an I/O or DQ terminal that is used to connect a memory array to other functional chips or to an I/O or DQ terminal that is used to connect to other functional circuitry within the same chip that contains the memory array. An example of the latter would be a memory macro that is embedded with a processor.

In order to test RAMS, it is necessary to apply many different patterns to the internal memory pattern inside the chip to find any and all defects. These defects are seen when the memory pattern inside the chip is such that the defect causes a memory cell to fail, or one memory cell or cells to interfere with another memory cell or cells. In accordance with the present invention, it has been discovered that the actual data pattern that is read off the chip is of no consequence. The fail is invariably caused by the pattern of data that is stored inside the memory. This is sometimes referred to as physical data, thereby describing the actual data physically stored in the memory rather than whether the data is a "1" or "0" coming off the chip. Furthermore, many chips are organized such that one input/output (I/O), or DQ, or bit, is stored in one array. Thus is the case that the same data pattern is applied to each DQ as function of the address to create the data disturb pattern inside the RAM. Therefore, in accordance with the present invention, it is sufficient to test with the same data patterns across the DQ pins. The pattern need only be a function of address to produce the physical patterns inside the memory necessary to test the device.

FIG. 1 shows the circuit for writing the test pattern into the chip. DQ0–DQN are input/output (I/O) pads or terminals for a memory chip. The I/O pads allow signals to go into memory or out of memory. DQ0–DQN are connected to the Off Chip Receivers OCR0–OCRN which act as input buffers. The Off Chip Receivers are circuits which include transistors that are designed to receive an input signal and essentially amplify it so that it is a full signal for use inside the chip. During write operation the Off Chip Receivers OCR0–OCRN present the input data to reference numerals DP0–DPN. DP0–DPN are data path circuits or write circuits which are active writing circuits which are required for the input data to be correctly written into the appropriate array address. The data path circuits are each individually connected to the memory cells in the arrays A0–AN which is a partitioned segment of a larger array. In "wide word" memories each array A0–AN is associated with one of the I/O terminals. Wide word memories are memories with wide input/output areas. In wide word memories each sub-array is associated with one of the I/O terminals. (An example would be for a 4 Megabit generation, a wide word DRAM would be 512 Kbits×512 Kbits×16 bits).

Reference numeral 10 is a Compare Enable Signal which is used to configure the chip during test mode. The Compare Enable Signal will remain high throughout the test mode during both the write cycle and the read cycle and will go low when the test mode is ended.

During test mode, input data may be written in parallel to multiple memory locations or arrays A0–AN during the write cycle by enabling multiple memory locations and simultaneously writing the same data thereto. The Off Chip Receivers OCR1–OCRN are ganged to one I/O, DQ0, using the Compare Enable Signal 10 which is applied to OCR1–OCRN. During test mode, when the Compare Enable Signal 10 goes high it configures the chip so that data that comes in DQ0 is sent simultaneously over to all the other Off Chip Receivers instead of using their own DQ pads. (In this example DQ0 is used to broadcast data to all the other memory arrays, but another I/O terminal may be used). As a result, the same physical pattern is written to each of the arrays. This allows a pattern applied to that single DQ to be applied to all arrays simultaneously. Therefore, parallel testing or compressed data testing is allowed to occur.

Figure 2:
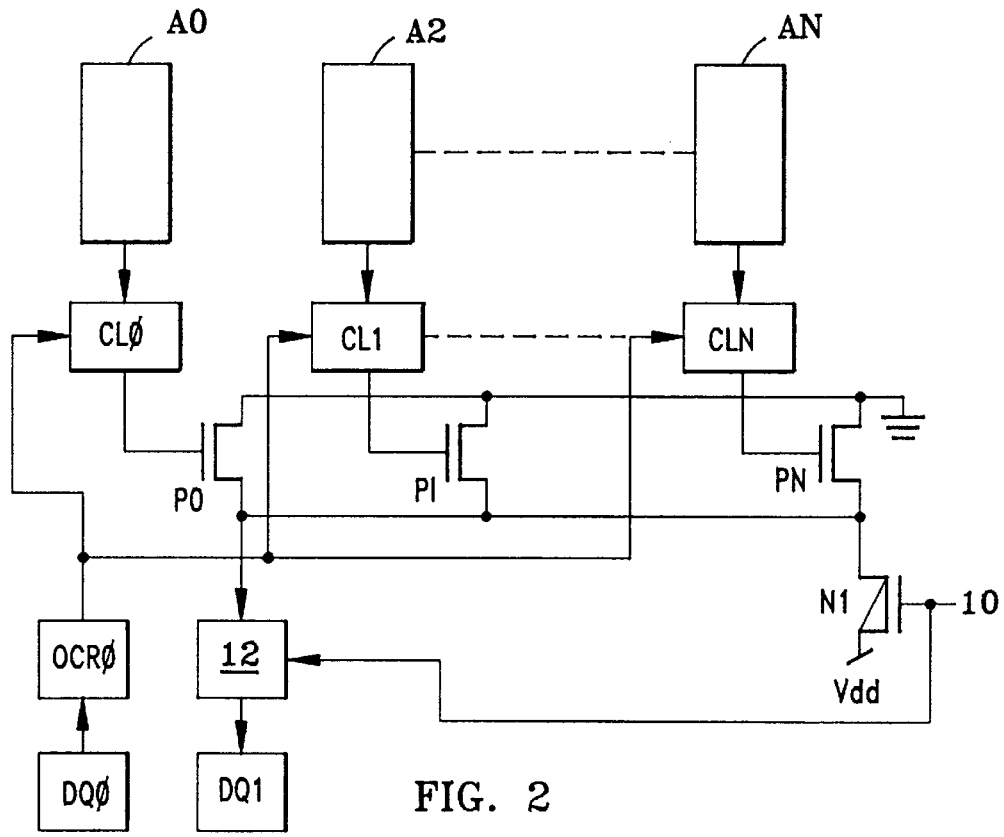
FIG. 2 shows the circuit for reading out a test result of the entire chip memory.

FIG. 2 shows the circuit for reading out the test result of the entire chip memory. The circuit has been enabled by the Compare Enable Signal 10 which turns off the gate of N-channel transistor N1 and as a result the source voltage Vdd no longer biases the circuit. Each array A0–AN is provided with its own compare logic circuit CL0–CLN. Upon entering the read cycle, the read pattern of each array A0–AN is compared to an expected read pattern which is inputted through DQ0 and OCR0 to all the compare logic circuits CL0–CLN simultaneously. The compare logic circuits CL0–CLN are connected to P-channel transistors P0–PN which are connected in parallel. The sources of the P-channel transistors P0–PN are connected to ground, the gates are connected to the compare logic circuits CL0–CLN, and the drains are connected to reference numeral 12 which is a Compare Logic Out circuit. As an example, when CL0 reads the data out of array A0 and compares it to the inputted expected data, CL0 will send a low signal to the gate of P0 and as a result a low signal will be sent to the Compare Logic Out circuit 12. If all of the compare logic circuits CL0–CLN show a match between the data read out of the arrays A0–AN and the expected data which was entered through DQ0, then all of the compare logic circuits CL0–CLN will send a low signal to the P-channel transistors P0–PN and low signals will be sent to the Compare Logic Out circuit 12. However, if there is a mismatch in at least one of the compare logic circuits CL0–CLN, then a high signal will be sent to the respective P-channel transistor and a high signal will be sent to the compare logic out circuit 12 indicating that an error has been found in one of the arrays A0–AN.

The present invention provides a means on the RAM to compare all the DQs when they are being read such that only two DQs are needed for test purposes. This can significantly reduce test cost since more devices can be tested in parallel.

Utilizing the RAM architecture, the present invention discloses a means to completely write to the RAM array using one DQ as opposed to the conventional means which use all DQs (for example, in the Synchronous Graphic Random Access Memory (SGRAM) case 32 DQs may be used). This invention teaches an improved way of testing random access memories by taking advantage of the partitioned nature of most RAM designs, especially wide I/O DRAMs. An advantage of the present invention is to provide a RAM having a reduced test time period. The present invention reduces the numbers of I/Os the tester needs to examine to test the chip and therefore compresses the test dimension in the I/O dimension. For example, a 256 KB×32 B chip can be tested the same as a 256 KB×4 chip. Therefore, a test compression of 8:1 has been achieved.

The present invention also discloses a means of reading the RAM array utilizing only two DQ pins (DQ0 and DQ1). One of said pins (DQ1) presents a high (logic one) or low (logic zero) state indicating the integrity of the RAM array. The second pin (DQ0) allows expected data to enter into the RAM as a means to guarantee verifying all arrays. For both the Read and Write functions the total number of DQ's required is two. One DQ for both Write Data and Integrity indicator, the second DQ for expect data.

The present invention discloses writing the same data to all arrays simultaneously, then simultaneously reading all the arrays and comparing the reads to an expected read or value, and thereafter having a combination of the compares determine if the chip passed the test.

The advantages of the present invention are that it can be utilized at all levels of test, e.g. wafer test, final module test, and during Burn-In testing. Burn-In testers and equipment are especially sensitive to I/O count of the DRAM device. Silicon area can be reduced when compared to the conventional implementation of compressed test modes.

This invention can also be utilized at higher levels of RAM assembly. For example, personal computers, and other memory type systems, verify RAM memory integrity at power-up time. As the system memory density increases, system non-availability time increases, due to more time required for memory verification. The above described invention greatly reduces the time required to verify the memory.

The present invention may be used to advantage to compress the time and number of I/O's required for testing wide, high pin count, or highly partitioned memory arrays.

Although the present invention has been described above in specific terms, the description should be regarded as illustrative rather than limitative. Thus, workers of ordinary skill in the art will appreciate that the invention may be otherwise practiced, but that such alternative modes are encompassed by the terms of the following claims and equivalents thereto.

We claim:

1. An integrated circuit comprising:

a plurality of I/O terminals including a first and second I/O terminal;

a plurality of memory arrays corresponding to each of said I/O terminals;

first test circuitry responsive to data bits on said first I/O terminal for simultaneously writing said data bits to said plurality of memory arrays; and second test circuitry for simultaneously reading the data bits from said plurality of memory arrays and for simultaneously comparing each of the data bits to an expected value of the data bits, said second test circuitry comprising:

a plurality of compare logic circuits corresponding to each of said plurality of memory arrays for performing a comparison between the data bits from the memory arrays and the expected value of the data bits;

a plurality of transistors connected to each of said plurality of compare logic circuits for indicating a failure of each of said plurality of memory arrays; and a compare logic out circuit connected to each of said plurality of transistors for providing an error signal if at least one of said plurality of transistors indicates a failure.

2. The integrated circuit of claim 1, wherein said second test circuitry outputs a test result to said second I/O terminal.

3. The integrated circuit of claim 1, wherein said first test circuitry comprises:

a plurality of off chip receiver circuits corresponding to each of said I/O terminals which are enabled by a compare enable signal.

4. The integrated circuit of claim 1, wherein said first test circuitry comprises:

a plurality of data path circuits corresponding to each of said I/O terminals.

5. The integrated circuit of claim 1, wherein the integrated circuit is a wide memory, high pin count memory, or a highly partitioned memory array.

6. An integrated circuit having a normal mode and a test mode of operation comprising:

a plurality of I/O terminals including a first and second I/O terminal;

a plurality of memory arrays corresponding to each of said I/O terminals;

writing means responsive to data bits on said first I/O terminal for simultaneously writing said data bits in parallel to said plurality of memory arrays;

reading means for simultaneously reading said data bits in parallel from said plurality of memory arrays; and comparing means for simultaneously comparing each of the data bits read from said plurality of memory arrays to an expected value of the data bits, and for outputting a test result to the second I/O terminal based on the comparisons, said comparing means comprising:

a plurality of compare logic circuits corresponding to each of said plurality of memory arrays for performing a comparison between the data bits from the memory arrays and the expected value of the data bits;

a plurality of transistors connected to each of said plurality of compare logic circuits for indicating a failure of each of said plurality of memory arrays; and a compare logic out circuit connected to each of said plurality of transistors for providing an error signal to the second I/O terminal if at least one of said plurality of transistors indicates a failure.

7. The integrated circuit of claim 6, wherein said writing means comprises:

a plurality of off chip receiver circuits corresponding to each of said I/O terminals which are enabled by a compare enable signal when the integrated circuit enters the test mode.

8. An integrated circuit comprising:

a plurality of I/O terminals including a first and second I/O terminal;

a plurality of memory arrays corresponding to each of said I/O terminals;

first test circuitry responsive to data bits on said first I/O terminal for simultaneously writing said data bits to said plurality of memory arrays; and second test circuitry for simultaneously comparing each of the data bits stored in said plurality of memory arrays to an expected value of the data bits, and for outputting a test result to the second I/O terminal based on the comparison, said second test circuitry comprising:

a plurality of compare logic circuits corresponding to each of said plurality of memory arrays for performing a comparison between the data bits from the memory arrays and the expected value of the data bits;

a plurality of transistors connected to each of said plurality of compare logic circuits for indicating a failure of each of said plurality of memory arrays; and a compare logic out circuit connected to each of said plurality of transistors for providing an error signal to the second I/O terminal if at least one of said plurality of transistors indicates a failure.

9. The integrated circuit of claim 1, wherein the expected value of the data bits is provided on the first I/O terminal.

10. The integrated circuit of claim 6, wherein the expected value of the data bits is provided on the first I/O terminal.

* * * * *